US012760758B2

(12) United States Patent
Pardeshi et al.

(10) Patent No.: US 12,760,758 B2
(45) Date of Patent: Oct. 13, 2026

(54) TORQUE SENSITIVE FASTENER ASSEMBLY FOR USE WITH INFORMATION HANDLING SYSTEM COMPONENTS

(71) Applicant: Dell Products L.P., Round Rock, TX (US)

(72) Inventors: Jayendrasingh Pardeshi, Leander, TX (US); Eduardo Escamilla, Round Rock, TX (US); Walter R. Carver, Round Rock, TX (US); Owen Kidd, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 117 days.

(21) Appl. No.: 18/954,816

(22) Filed: Nov. 21, 2024

(65) Prior Publication Data

US 2026/0139702 A1 May 21, 2026

(51) Int. Cl.
*F16B 31/02* (2006.01)
*H05K 7/14* (2006.01)

(52) U.S. Cl.
CPC ........... *F16B 31/02* (2013.01); *H05K 7/1489* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,502,825 | A * | 3/1985 | Yamada | F16B 31/021 411/910 |
| 7,611,100 | B2 * | 11/2009 | Peng | G11B 33/124 361/679.02 |
| 8,451,593 | B2 * | 5/2013 | Ma | H05K 5/0217 361/679.02 |
| 10,436,236 | B2 * | 10/2019 | Hodsdon | F16B 31/043 |
| 11,988,236 | B2 * | 5/2024 | Gunsjö | F16B 13/04 |
| 12,219,726 | B2 * | 2/2025 | Escamilla | H05K 7/1402 |
| 12,448,997 | B2 * | 10/2025 | Rice | F16B 31/02 |
| 2004/0130865 | A1 * | 7/2004 | Vanderheyden | G11B 33/128 |
| 2026/0043435 | A1 * | 2/2026 | Rice | F16B 31/02 |

* cited by examiner

*Primary Examiner* — Lisa Lea-Edmonds
(74) *Attorney, Agent, or Firm* — Terrile, Cannatti & Chambers, LLP; Stephen A. Terrile

(57) ABSTRACT

A fastener assembly for use with an information handling system. The fastener assembly includes a housing component, the housing component comprising a clutch housing portion and a threaded portion and a torque sensitive clutch mechanism, the torque sensitive clutch mechanism being rotatably mounted within the clutch housing portion of the housing component, the torque sensitive clutch mechanism providing the fastener assembly with a torque control function.

18 Claims, 5 Drawing Sheets

TORQUE SENSITIVE FASTENER ASSEMBLY FOR USE WITH INFORMATION HANDLING SYSTEM COMPONENTS

BACKGROUND OF THE INVENTION

Field of the Invention

The present invention relates to information handling systems. More specifically, embodiments of the invention relate to fasteners used within information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY OF THE INVENTION

A system and method for providing an information handling system with a torque sensitive fastener assembly for use with expansion components.

In one embodiment, the invention relates to a fastener assembly for use with an information handling system, comprising: a housing component, the housing component comprising a clutch housing portion and a threaded portion; and, a torque sensitive clutch mechanism, the torque sensitive clutch mechanism being rotatably mounted within the clutch housing portion of the housing component, the torque sensitive clutch mechanism providing the fastener assembly with a torque control function.

In another embodiment, the invention relates to an information handling system component comprising: an attachable component; and, a fastener assembly for attaching the attachable component, the fastener assembly comprising: a housing component, the housing component comprising a clutch housing portion and a threaded portion; and, a torque sensitive clutch mechanism, the torque sensitive clutch mechanism being rotatably mounted within the clutch housing portion of the housing component, the torque sensitive clutch mechanism providing the fastener assembly with a torque control function.

In another embodiment, the invention relates to a system comprising: a chassis; a processor contained within the chassis; a data bus coupled to the processor; an attachable component; and, a fastener assembly, the fastener assembly attaching the attachable component to the system, the fastener assembly comprising: a housing component, the housing component comprising a clutch housing portion and a threaded portion; and, a torque sensitive clutch mechanism, the torque sensitive clutch mechanism being rotatably mounted within the clutch housing portion of the housing component, the torque sensitive clutch mechanism providing the fastener assembly with a torque control function.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
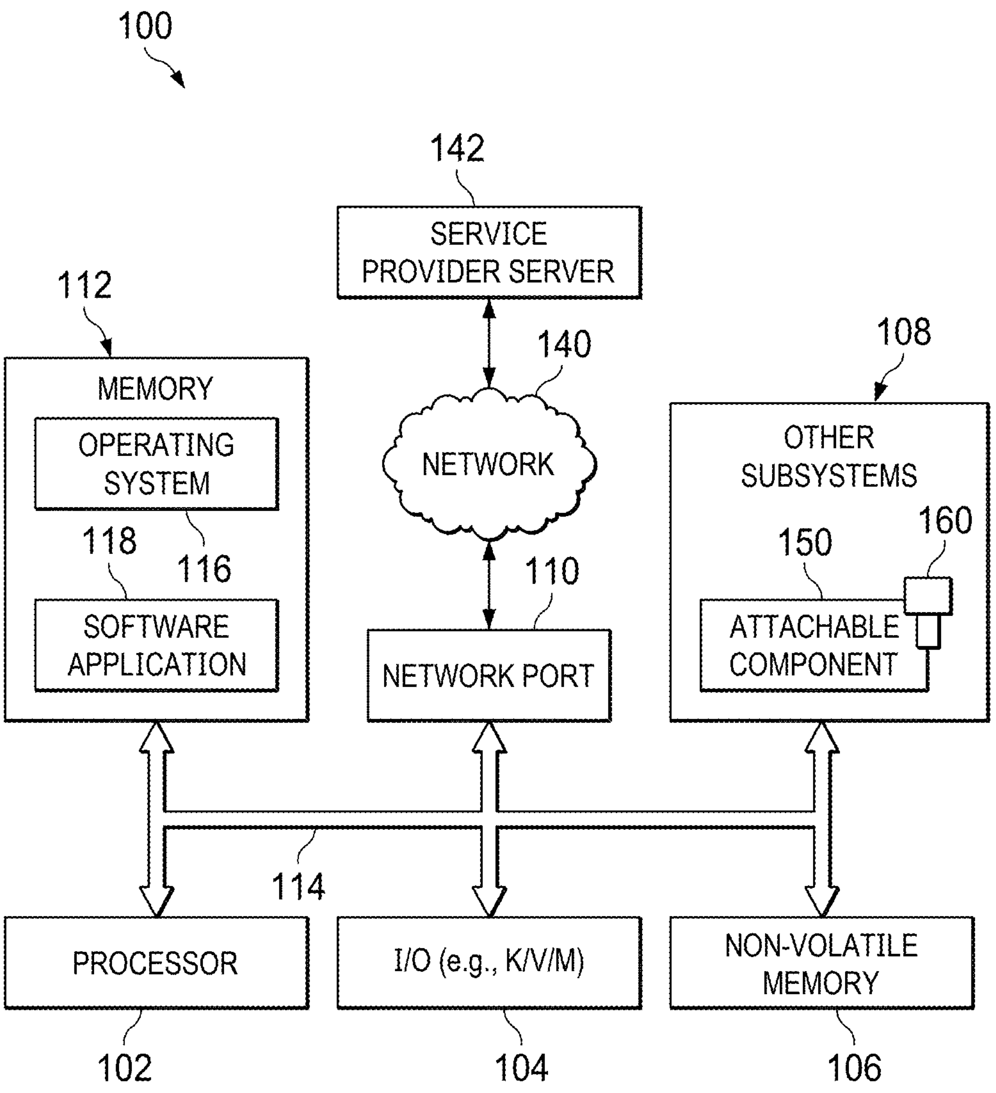
FIG. 1 shows a general illustration of components of an information handling system as implemented in the system and method of the present invention.

Various aspects of the disclosure include an appreciation that it is known to provide information handling systems with expansion components. Examples of expansion component include system on chip type components, graphics processing unit type components, accelerator type components, etc. Various aspects of the disclosure include an appreciation that certain expansion components may be instantiated as expansion cards which mate with connectors included within the information handling system. Various aspects of the present disclosure include an appreciation that certain expansion components are growing more sensitive in their mating and assembly tolerances.

Various aspects of the disclosure include an appreciation that it is desirable to attach expansion components by applying a defined amount of torque to a fastening device. Various aspects of the disclosure include an appreciation that a defined amount of torque is not always applied during manufacture of information handling system platforms. Various aspects of the disclosure include an appreciation that not applying a defined amount of torque can result in negative performance issues for the information handling system. For example, loose torquing can cause bus errors, connectivity issues, and reduced performance with the high-speed interconnect communication links such as those used with GPU type components such as the Nvidia NVLink communication link.

Various aspects of the present disclosure include an appreciation that various devices which perform a torque limiting function are known. For example, a torque wrench performs a torque limiting function. Another example of a device which performs a torque limiting function is a friction clutch (also referred to as a slip clutch) which uses friction plates or balls to slip when torque exceeds a preset limit, preventing further torque transmission. Another example of a device which performs a torque limiting function is a shear pin which is effectively a mechanical fuse that breaks or shears off when torque exceeds a predetermined level, effectively disconnecting the drivetrain. Another example of a device which performs a torque limiting function is a torque limiter coupling which incorporates a mechanism to disengage or slip when torque exceeds a set limit, protecting connected components. Another example of a device which performs a torque limiting function is a magnetic clutch which uses magnetic force to slip when torque exceeds a certain threshold, allowing overload protection. Another example of a device which performs a torque limiting function is a ratchet mechanism which engages only in one direction and slips or disengages in the opposite direction when torque exceeds a set value. Another example of a device which performs a torque limiting function is an overload clutch which engages and disengages automatically when torque reaches a certain threshold, protecting equipment from overload. Another example of a device which performs a torque limiting function is a safety coupling which automatically disconnects in case of torque overload to prevent damage to machinery or components. Another example of a device which performs a torque limiting function is a spring-loaded clutch which utilizes springs to regulate torque transmission and disengage when torque exceeds a preset limit. Another example of a device which performs a torque limiting function is an adjustable torque limiter which allows for manual adjustment of the torque limit, providing flexibility in different operating conditions. Another example of a device which performs a torque limiting function is a hydraulic or pneumatic overload protection device which uses fluid or gas pressure to control torque transmission and prevent overload situations. However, none of these devices which perform a torque limiting function provide a reliable solution for managing application of a defined amount of torque when fastening expansion components within an information handling system.

Various aspects of the disclosure include an appreciation that it would be desirable to provide a reliable solution for managing application of defined amount of torque when fastening expansion components within an information handling system. Various aspects of the disclosure include an appreciation that it would be desirable to provide an integrated torque sensitive fastener device for use in information handling system designs. Various aspects of the disclosure include an appreciation that it would be desirable to provide a torque sensitive fastener device which may be used with simple tools to provide proper torque in a more reliable way during the assembly process of an information handling system.

A system and method are disclosed for providing an information handling system with a torque sensitive fastener assembly. In certain embodiments, the torque sensitive fastener assembly includes a torque sensitive clutch mechanism. Such a torque sensitive fastener assembly ceases to spin once a set torque is reached while also being reversible at any torque.

In certain embodiments, the torque sensitive fastener assembly includes a housing component, a tool receiving component, a spring component, a top clutch element, or a combination thereof. In certain embodiments, the housing component defines a housing recess. In certain embodiments, the housing recess is substantially cylindrical. In certain embodiments, a bottom portion of the housing recess defines a bottom clutch portion. In certain embodiments, the top clutch element mates with the bottom clutch portion. In certain embodiments, the torque sensitive clutch mechanism includes one or more of the tool receiving component, the spring component, the top clutch element, the bottom clutch portion, or a combination thereof.

Such a torque sensitive fastener assembly advantageously provides a compact design for use in information technology products. Further, such a torque sensitive fastener assembly includes a torque sensitive clutch mechanism which is enclosed within a housing, thus preventing fine metal powder from contaminating other components within the information handling system.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. In various embodiments, one or both the other subsystems 108 or the network port 110 include an attachable component 150 (which may be configured as an expansion card), a fastener 160, or a combination thereof. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

In certain embodiments, the information handling system 100 comprises a server type information handling system. In certain embodiments, the server type information handling system comprises a blade server type information handling system. As used herein, a blade server type information handling system broadly refers to an information handling system which is physically configured to be mounted within a server rack.

In certain embodiments, the attachable component 150 is attached to one or more components of the information handling system via the fastener 160. In certain embodiments, the attachable component 150 is attached within a chassis of the information handling system via the fastener 160. In certain embodiments, the attachable component includes a torque limited component. In certain embodiments, the attachable component includes a central processing unit, a system on a chip, a graphics processing module, a heat sink, a liquid cooling device such as a liquid cooling plate, etc. In certain embodiments, the fastener 160 includes a torque sensitive fastener assembly. In certain embodiments, the torque sensitive fastener assembly includes a torque sensitive clutch mechanism. Such a torque sensitive fastener assembly ceases to spin once a set torque is reached while also being reversible at any torque. In certain embodiments, an information handling system component system includes an attachable component 150 and a fastener 160. In certain embodiments, the one or more fasteners 160 attach the attachable component to a chassis of the information handling system. As used herein, attaching an attachable component to the chassis includes directly attaching the attachable component to the chassis, indirectly attaching the attachable component to the chassis (i.e., attaching the attachable component to another component which in turn is directly or indirectly attached to the chassis), or a combination thereof. For example, the attachable component 150 may be attached to a high performance module which is in turn attached to the chassis. It will be appreciated that with certain types of attachable components, other attachment means (e.g., connectors) may be employed in addition to the fastener 160.

In certain embodiments, the torque sensitive fastener assembly includes a housing component, a tool receiving component, a spring component, a top clutch element, or a combination thereof. In certain embodiments, the housing component defines a housing recess. In certain embodiments, the housing recess is substantially cylindrical. In certain embodiments, a bottom portion of the housing recess defines a bottom clutch portion. In certain embodiments, the top clutch element mates with the bottom clutch portion. In certain embodiments, the torque sensitive clutch mechanism includes one or more of the tool receiving component, the spring component, the top clutch element, the bottom clutch portion, or a combination thereof.

Such a torque sensitive fastener assembly advantageously provides a compact design for use in information technology products. Further, such a torque sensitive fastener assembly includes a torque sensitive clutch mechanism which is enclosed within a housing, thus preventing fine metal powder from contaminating other components within the information handling system.

Figure 2A:
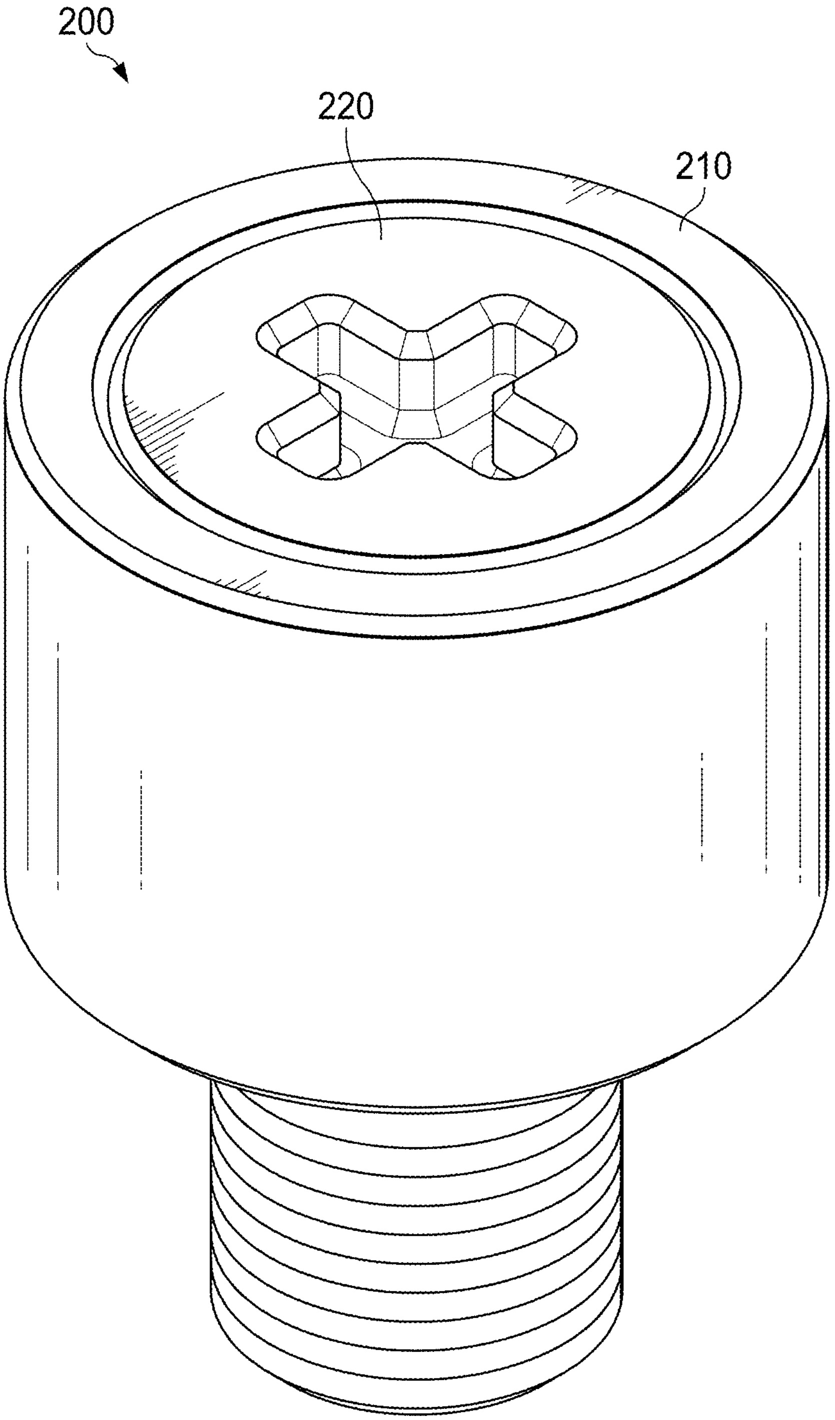
FIGS. 2A, 2B and 2C, generally referred to as FIG. 2, show a plurality of views of a fastener assembly.
Figure 2B:
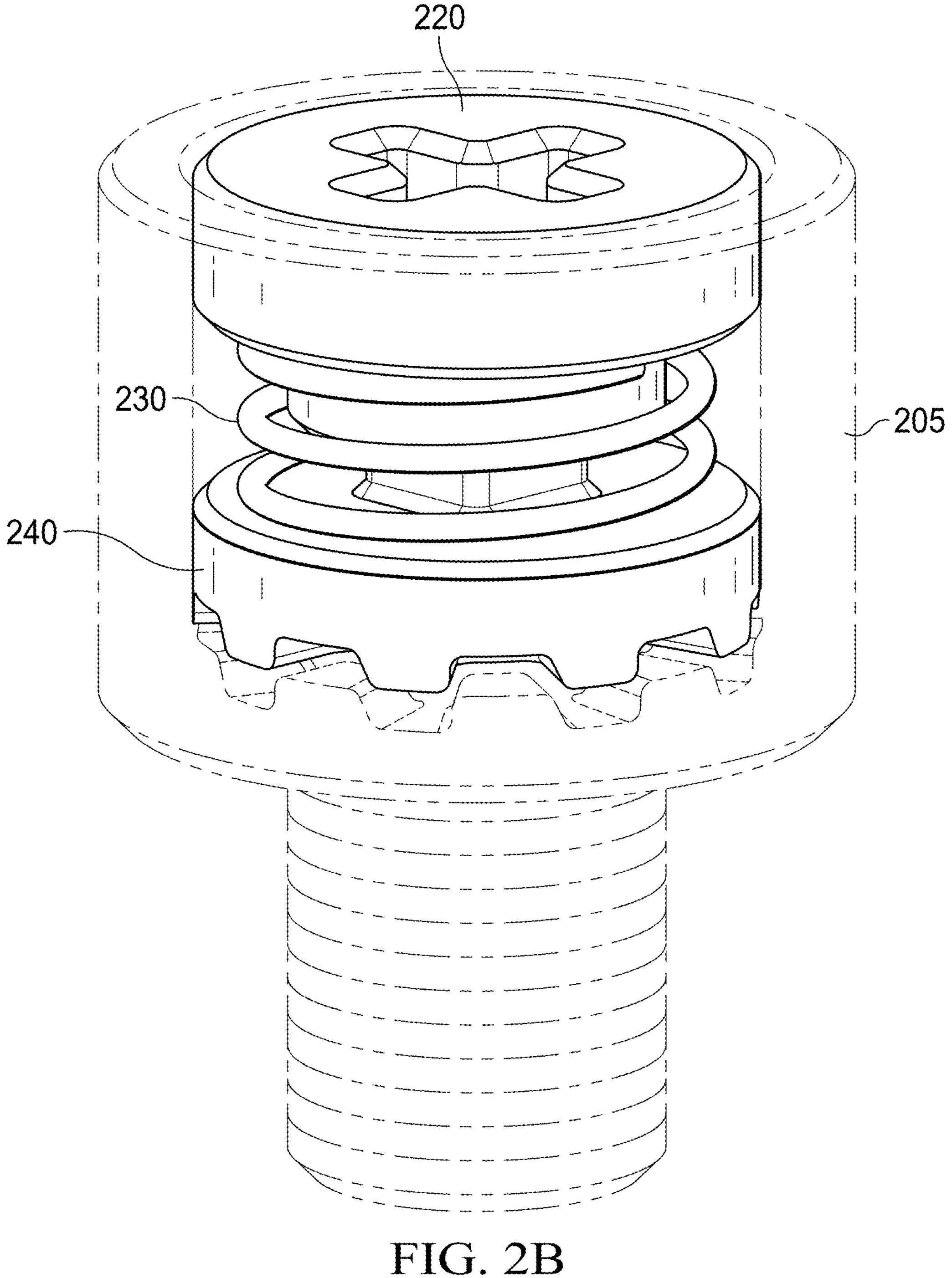
Figure 2C:
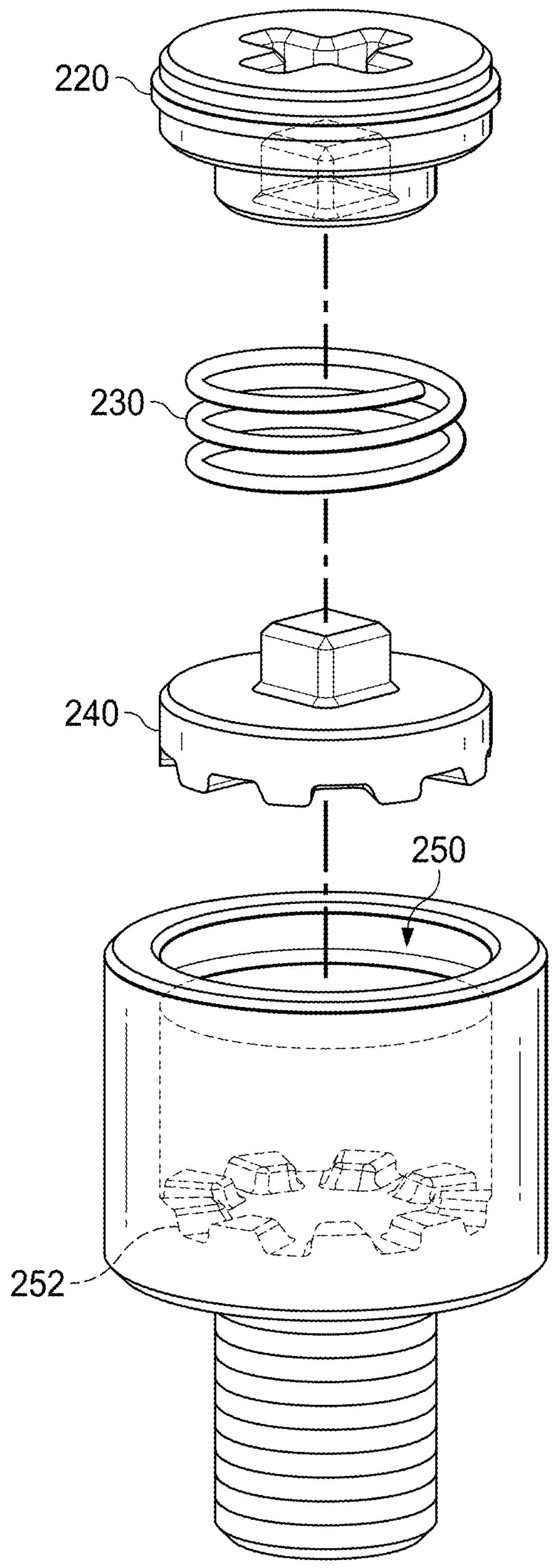

FIGS. 2A, 2B and 2C, generally referred to as FIG. 2, show a plurality of views of a fastener assembly 200. More specifically, FIG. 2A shows a perspective view of a fastener assembly 200. FIG. 2B shows a cut away perspective view of a fastener assembly 200. FIG. 2C shows an exploded perspective view of a fastener assembly 200. In certain embodiments, the fastener assembly 200 corresponds to fastener 160.

In certain embodiments, the fastener assembly 200 includes a torque sensitive clutch mechanism 205. In certain embodiments, the torque sensitive clutch mechanism 205 provides a torque control function. As used herein, a torque control function broadly refers to a fastener operation in which the fastener assembly rotates during insertion until a predetermined amount of torque is achieved, after which the fastener assembly ceases to spin. In certain embodiments, the fastener assembly 200 is removable even after the predetermined amount of torque is achieved. In certain embodiments, the fastener assembly 200 ceases to spin once a predetermined amount of torque is reached while also being reversible at any torque to facilitate removal of the fastener assembly 200. In certain embodiments, the predetermined amount of torque is substantially (i.e., +/−20%) 12 lb-in.

In certain embodiments, the torque sensitive fastener assembly 200 includes a housing component 210, a tool receiving component 220, a spring component 230, a top clutch element 240, or a combination thereof. In certain embodiments, the tool receiving component 220 is rotatably mounted within the housing component 210. In certain embodiments, the spring component 230 is mounted between the tool receiving component 220 and the top clutch element 240. In certain embodiments, the spring component 230 exerts a force between an underside of the tool receiving component 220 and a top side of the top clutch element 240.

In certain embodiments, the housing component 210 defines a housing recess 250. In certain embodiments, the housing recess is substantially cylindrical. In certain embodiments, the tool receiving component 220 is rotatably mounted within the housing recess 250. In certain embodiments, the torque sensitive clutch mechanism 205 is rotatably mounted within the housing component. In certain embodiments, the tool receiving component 220 defines a clutch element recess. In certain embodiments, the top clutch element 240 includes an attachment projection. In certain embodiments, the attachment projection of the top clutch element 240 mates with the clutch element recess of the tool receiving component 220 when the tool receiving element and the clutch element are assembled within housing recess 250 of the housing component 210.

In certain embodiments, a bottom portion of the housing recess defines a bottom clutch portion 252. In certain embodiments, the top clutch element 240 mates with the bottom clutch portion 252. In certain embodiments, top clutch element 240 mates with the bottom clutch portion 252 when the top clutch element 240 is assembled within housing recess 250 of the housing component 210. In certain embodiments, the torque sensitive clutch mechanism 205 includes one or more of the tool receiving component 220, the spring component 230, the top clutch element 240, the bottom clutch portion 252, or a combination thereof.

In certain embodiments, the housing component 210 includes a clutch housing portion 260, a threaded portion 262, or a combination thereof. In certain embodiments, the clutch housing portion 260 and the threaded portion 262 are constructed from a single piece of material. In certain embodiments, the tool receiving component 220 is rotatably mounted within the clutch housing portion 260. In certain embodiments, the clutch housing portion 260 has a diameter of substantially (i.e., +/−20%) 8 mm. In certain embodiments, the clutch housing portion 260 has a height of substantially (i.e., +/−20%) 6 mm. In certain embodiments, the threaded portion 262 has a height of substantially (i.e., +/−20%) 5 mm. In certain embodiments, the threaded portion 262 has a diameter of substantially (i.e., +/−20%) 4, a pitch diameter of substantially (i.e., +/−20%) 3.545 mm, or a combination thereof. In certain embodiments, the threaded portion 262 is configured as a M4 type thread.

Such a fastener assembly 200 advantageously provides a compact design for use in information technology products. Further, such a torque sensitive fastener assembly includes a torque sensitive clutch mechanism which is enclosed within a housing, thus preventing fine metal powder from contaminating other components within the information handling system.

Figure 3:
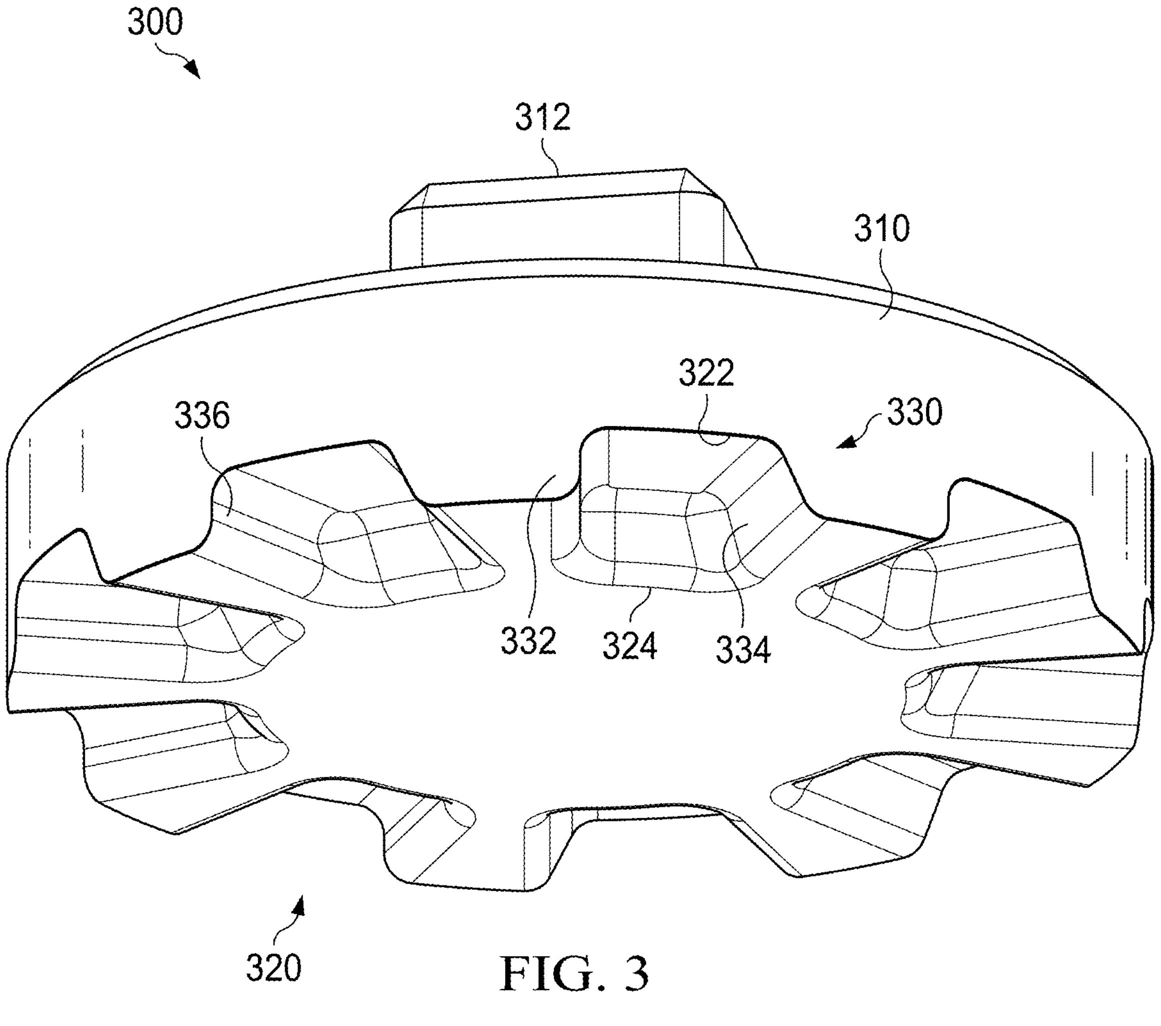
FIG. 3 shows a perspective view of a clutch component of a fastener assembly.

FIG. 3 shows a perspective view of a clutch component 300 of a fastener assembly. In certain embodiments, the clutch component 300 corresponds to top clutch element 240. In certain embodiments, the clutch component 300 includes a clutch component housing 310. In certain embodiments, the clutch housing 310 is substantially (i.e., +/−20%) cylindrical. In certain embodiments, the clutch housing 310 includes a tool mating portion 312. In certain embodiments, the tool mating portion 312 includes a projection which mates with a recess defined by a tool receiving component. In certain embodiments, the projection is substantially (i.e., +/−20%) shaped as a rectangular cuboid. In certain embodiments, the projection is substantially (i.e., +/−20%) cube shaped.

In certain embodiments, the clutch component housing 310 defines a plurality of clutch recesses 320. In certain embodiments, the plurality of clutch recesses 320 extends around a peripheral edge of a surface of the clutch component housing 310. In certain embodiments, the surface is opposite the surface on which the tool mating portion 312 is located. In certain embodiments, each of the plurality of clutch recesses 320 includes an edge opening 322, an interior portion 324, or a combination thereof. In certain embodiments, each of the plurality of edge opening 322 extends around a peripheral edge of the clutch component housing 310. In certain embodiments, a width of the edge opening 322 is wider than a width of the interior portion 324.

In certain embodiments, each of the plurality of clutch recesses 320 includes an insertion portion 330, a removal portion 332, or a combination thereof. In certain embodiments, the insertion portion 330 applies a rotational force against a corresponding insertion portion of a bottom clutch portion of a fastener assembly housing component when an insertion action (such as rotating a tool receiving component by a tool) is performed by a user. In certain embodiments, the insertion portion 330 includes a ramped surface 334. In certain embodiments, the ramped surface 334 allows for slipping between the clutch component and the bottom clutch portion when a torque limit is reached. In certain embodiments, each clutch recess of bottom clutch portion includes a corresponding ramped surface.

In certain embodiments, the removal portion 332 applies a rotational force against a corresponding removal portion of a bottom clutch portion of a fastener assembly housing component when a removal action (such as rotating a tool receiving component by a tool) is performed by a user. In certain embodiments, the removal portion 332 includes a substantially (i.e., +/−20%) vertical surface 336. In certain embodiments, the vertical surface 336 prevents slipping between the clutch component and the bottom clutch portion when a fastener assembly is unfastened. In certain embodiments, each clutch recess of the bottom clutch portion includes a corresponding vertical surface.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A fastener assembly for use with an information handling system, comprising:

a housing component, the housing component comprising a clutch housing portion and a threaded portion; and, a torque sensitive clutch mechanism, the torque sensitive clutch mechanism being rotatably mounted within the clutch housing portion of the housing component, the torque sensitive clutch mechanism providing the fastener assembly with a torque control function.

2. The fastener assembly of claim 1, wherein:

the torque sensitive clutch mechanism includes a tool receiving component, a spring component and a top clutch element, the spring component exerting a force between an underside of the tool receiving component and a top side of the top clutch element.

3. The fastener assembly of claim 2, wherein:

the tool receiving component defines a clutch element recess;

the clutch element includes an attachment projection; and, the attachment projection of the clutch element mates with the clutch element recess of the tool receiving component when the tool receiving element and the clutch element are assembled within the housing component.

4. The fastener assembly of claim 2, wherein:

a bottom portion of the clutch housing portion of the housing component defines a bottom clutch portion; and, the clutch element mates with the bottom clutch portion when the clutch element is assembled within the housing component.

5. The fastener assembly of claim 2, wherein:

the clutch element includes a clutch housing; and, the clutch housing defines a plurality of clutch recesses extending around a peripheral edge of the clutch housing.

6. The fastener assembly of claim 5, wherein:

each of the plurality of clutch recesses include an insertion portion and a removal portion.

7. An information handling system component system comprising:

an attachable component; and, a fastener assembly for attaching the attachable component, the fastener assembly comprising:

a housing component, the housing component comprising a clutch housing portion and a threaded portion; and, a torque sensitive clutch mechanism, the torque sensitive clutch mechanism being rotatably mounted within the clutch housing portion of the housing component, the torque sensitive clutch mechanism providing the fastener assembly with a torque control function.

8. The expansion system of claim 7, wherein:

the torque sensitive clutch mechanism includes a tool receiving component, a spring component and a top clutch element, the spring component exerting a force between an underside of the tool receiving component and a top side of the top clutch element.

9. The expansion system of claim 8, wherein:

the tool receiving component defines a clutch element recess;

the clutch element includes an attachment projection; and, the attachment projection of the clutch element mates with the clutch element recess of the tool receiving component when the tool receiving element and the clutch element are assembled within the housing component.

10. The expansion system of claim 8, wherein:

a bottom portion of the clutch housing portion of the housing component defines a bottom clutch portion; and, the clutch element mates with the bottom clutch portion when the clutch element is assembled within the housing component.

11. The expansion system of claim 8, wherein:

the clutch element includes a clutch housing; and, the clutch housing defines a plurality of clutch recesses extending around a peripheral edge of the clutch housing.

12. The expansion system of claim 11, wherein:

each of the plurality of clutch recesses include an insertion portion and a removal portion.

13. A system comprising:

a chassis;

a processor contained within the chassis;

a data bus coupled to the processor; and, an attachable component;

a fastener assembly for attaching the attachable component to the chassis, the fastener assembly comprising:

a housing component, the housing component comprising a clutch housing portion and a threaded portion; and, a torque sensitive clutch mechanism, the torque sensitive clutch mechanism being rotatably mounted within the clutch housing portion of the housing component, the torque sensitive clutch mechanism providing the fastener assembly with a torque control function.

14. The system of claim 13, wherein:

the torque sensitive clutch mechanism includes a tool receiving component, a spring component and a top clutch element, the spring component exerting a force between an underside of the tool receiving component and a top side of the top clutch element.

15. The system of claim 14, wherein:

a bottom portion of the clutch housing portion of the housing component defines a bottom clutch portion; and, the clutch element mates with the bottom clutch portion when the clutch element is assembled within the housing component.

16. The system of claim 14, wherein:

the tool receiving component defines a clutch element recess;

the clutch element includes an attachment projection; and, the attachment projection of the clutch element mates with the clutch element recess of the tool receiving component when the tool receiving element and the clutch element are assembled within the housing component.

17. The system of claim 14, wherein:

the clutch element includes a clutch housing; and, the clutch housing defines a plurality of clutch recesses extending around a peripheral edge of the clutch housing.

18. The system of claim 17, wherein:

each of the plurality of clutch recesses include an insertion portion and a removal portion.

* * * * *